United States Patent
Chen (10) Patent No.: US 12,328,123 B2
(45) Date of Patent: Jun. 10, 2025

(54) SWITCHING FREQUENCY CONTROLLER, VOLTAGE CONVERTER, AND METHOD FOR CONTROLLING SWITCHING FREQUENCY

(71) Applicant: ALPHA AND OMEGA SEMICONDUCTOR INTERNATIONAL LP, Toronto (CA)

(72) Inventor: Bu-Wei Chen, Zhubei (TW)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 70 days.

(21) Appl. No.: 18/214,693

(22) Filed: Jun. 27, 2023

(65) Prior Publication Data

US 2025/0007500 A1    Jan. 2, 2025

(51) Int. Cl.
*H03K 5/00* (2006.01)
*H03K 21/10* (2006.01)
*H03L 7/193* (2006.01)

(52) U.S. Cl.
CPC ......... *H03K 5/00006* (2013.01); *H03K 21/10* (2013.01); *H03L 7/193* (2013.01)

(58) Field of Classification Search
CPC .... H03K 5/00006; H03K 21/10; H03L 7/193; H03L 7/0992; H03L 7/1976; H03L 7/199; H03L 7/0994; H03L 7/148; H03L 7/146; H03L 7/14; H03L 7/0991; H03L 7/099
See application file for complete search history.

(56) References Cited

U.S. PATENT DOCUMENTS

| | | | |
|---|---|---|---|
| 8,159,276 B2* | 4/2012 | Mehas | H03L 7/0992 327/158 |
| 11,405,025 B1* | 8/2022 | Hao | H03L 7/0995 |
| 2008/0174349 A1* | 7/2008 | Luo | H03L 7/095 327/157 |
| 2013/0113528 A1* | 5/2013 | Frantzeskakis | H03L 7/104 327/117 |

* cited by examiner

*Primary Examiner* — John W Poos
(74) *Attorney, Agent, or Firm* — Chen-Chi Lin (57) ABSTRACT

A switching frequency controller, a voltage converter, and a method are used for controlling switching frequency. The switching frequency controller includes a frequency divider, a frequency detector, an accumulation counter, and an on-time controller. The frequency divider generates a divisional signal having a divisional frequency according to an input signal having a target frequency. The target frequency is $2^N$ times of the divisional frequency. The frequency detector receives the divisional frequency and a switching control signal, and calculate a number of periods that pass by during each cycle of the divisional signal. The number of periods is represented by (N+1) bits. The accumulation counter increases or decreases a control indication value by a predetermined value according to a most significant bit of the number of periods. The on-time controller adjusts an on-time length of the switching control signal according to the control indication value.

20 Claims, 6 Drawing Sheets

SWITCHING FREQUENCY CONTROLLER, VOLTAGE CONVERTER, AND METHOD FOR CONTROLLING SWITCHING FREQUENCY

FIELD OF THE INVENTION

The present disclosure relates generally to a switching frequency controller. More particularly, the present disclosure relates to a switching frequency controller capable of adjusting an on-time of a switching control signal so as to fix the switching frequency.

BACKGROUND OF THE INVENTION

In electronic devices, different electronic components may require different supply voltages; thus, dc-dc synchronous voltage converters are often used to convert the power supply voltage into the voltages required for various electronic components. Among various dc-dc synchronous voltage converters, voltage converters controlled by constant on-time (COT) methodology have gained wide application due to their advantages of short transient response time and simple structure. Generally, for a voltage converter controlled by the constant on-time methodology, the length of on-time, in which the charging switch is turned on, is fixed, while the length of off-time, in which the charging switch is turned off, is variant according to the difference between the present output voltage and the target voltage. As a result, the frequency of the switching control signal is not constant. Moreover, when electronic components switch between different operating modes, the load current of the voltage converter may vary accordingly, thereby causing changes in the frequency of the switching control signal. In some cases, the frequency of the control signal may gradually deviate from the expected frequency, leading to electromagnetic interference (EMI) among electronic components and potential degradation of circuit performance. Therefore, how to design a controller that can maintain the switching frequency of switches has become an urgent issue in the related field.

SUMMARY OF THE INVENTION

A switching frequency controller includes a frequency divider, a frequency detector, an accumulation counter and an on-time controller. The frequency divider is configured to generate a divisional signal having a divisional frequency according to a target signal having a target frequency, wherein the target frequency is $2^N$ times of the divisional frequency, and N is a positive integer. The frequency detector is coupled to the frequency divider and configured to receive the divisional signal and a switching control signal generated by a control signal generator, and calculate the number of period of the switching control signal that pass by during each cycle of the divisional signal.

Each cycle of the divisional signal includes an on-time and an off-time having different potentials, and the number of periods is represented by (N+1) bits. The accumulation counter is coupled to the frequency detector and configured to set an indication value as a starting value during an initial stage and increase or decrease the indication value by a predetermined amount according to a most significant bit of the number of periods. The on-time controller is coupled to the accumulation counter and configured to adjust a parameter of the control signal generator according to the indication value so as to adjust an on-time length of the switching control signal.

A voltage converter includes a switching frequency controller and a control signal generator.

A method controls a switching frequency of a switch. The method includes the steps of: using a control signal generator to generate a switching control signal to control the switch, wherein each cycle of a divisional signal includes an on-time and an off-time having different potentials; generating a divisional signal having a divisional frequency according to a target signal having a target frequency, wherein the target frequency is $2^N$ times of the divisional frequency, and wherein N is a positive integer; calculating the number of periods of the switching control signal that pass by during each cycle of the divisional signal, wherein the number of periods is represented by (N+1) bits; setting an indication value as a starting value during an initial stage; increasing or decreasing the indication value by a predetermined amount according to a most significant bit of the number of periods; and adjusting a parameter of the control signal generator according to the indication value so as to adjust an on-time length of the switching control signal.

The switching frequency controller, the voltage converter, and the method monitors the frequency of the switching control signal by dividing the target frequency and then comparing it with the switching control frequency, and adjusts the on-time length of the switching control signal accordingly, so that the switching control signal can be effectively controlled within a range close to the target frequency, thereby reducing the problems of electromagnetic interference and degradation of circuit performance that may arise in the prior art.

DETAILED DESCRIPTION OF THE INVENTION

Figure 1:
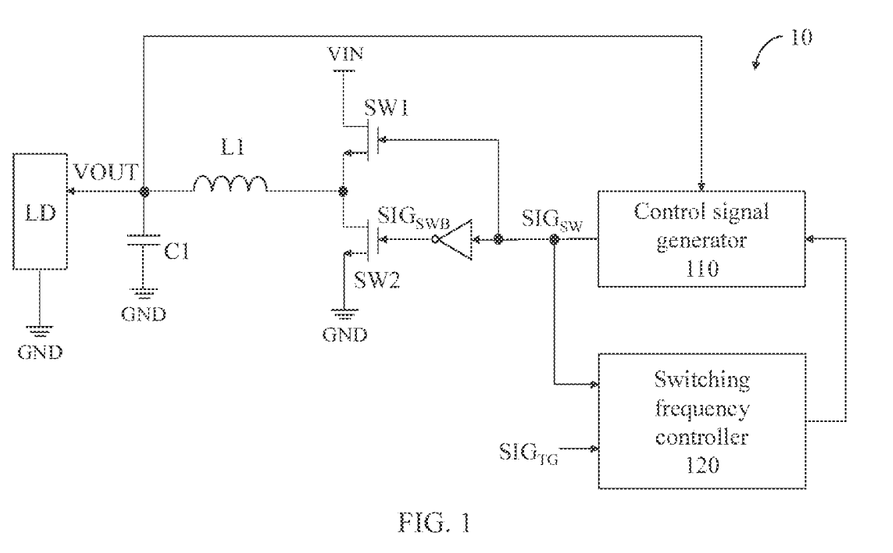
FIG. 1 is a schematic diagram illustrating a voltage converter in examples of the present disclosure.

FIG. 1 is a schematic diagram illustrating a voltage converter 10 according to one example of the present disclosure. In the present example, the voltage converter 10 is configured to convert an input voltage VIN to a lower output voltage VOUT, that is, the voltage converter 10 can be, for example, a voltage drop convertor. The voltage converter 10 includes a control signal generator 110, switches SW1 and SW2, an inductor L1, a capacitor C1 and a switching frequency controller 120.

As shown in FIG. 1, the switch SW1 has a first terminal, a second terminal and a control terminal, wherein the first terminal of the switch SW1 may receive an input voltage VIN, and the control terminal of the switch SW1 may receive a switching control signal $SIG_{SW}$. The switch SW2 has a first terminal, a second terminal and control terminal, wherein the first terminal of the switch SW2 is coupled to the second terminal of the switch SW1, the second terminal of the switch SW2 is coupled to the ground terminal GND, and the control terminal of the switch SW2 may receive an inverted control signal $SIG_{SWB}$ that is complement to the switching control signal $SIG_{SW}$. The inductor L1 has a first terminal and a second terminal, the first terminal of the inductor L1 is coupled to the second terminal of the switch SW1, and the second terminal of the inductor L1 may output a converted voltage VOUT. The capacitor C1 has a first terminal and a second terminal, the first terminal of the capacitor C1 is coupled to the second terminal of the inductor L1, and the second terminal of the capacitor C1 is coupled to the ground terminal GND.

Figure 2:
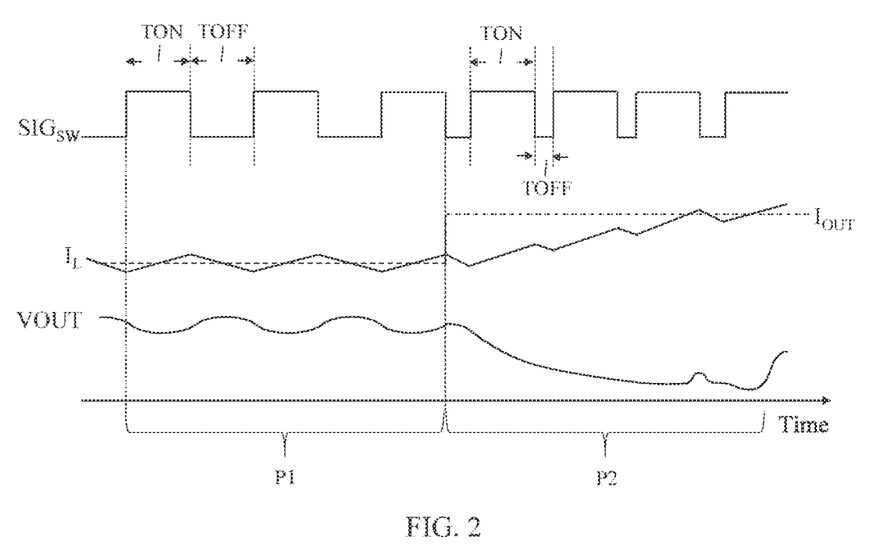
FIG. 2 is a waveform diagram of the signal of a voltage converter in examples of the present disclosure.

FIG. 2 is a waveform diagram of the signal of the voltage converter 10 according to one example of the present disclosure. It should be noted that the waveforms shown in FIG. 2 are used for illustration but not to limit the waveforms of the output voltage VOUT, the inductor current $I_L$ and the output current $I_{OUT}$, and in other examples, the actual waveforms of the output voltage VOUT, the inductor current $I_L$ and the output current $I_{OUT}$ may vary depending on the components used in the voltage converter.

In the present example, the control signal generator 110 may generate the switching control signal $SIG_{SW}$, and as shown in FIG. 2, each cycle of the switching control signal $SIG_{SW}$ may include an on-time TON and an off-time TOFF having different potentials. In the present example, the switching control signal $SIG_{SW}$ is in the logic high voltage during the on-time TON, and at this time, the switch SW1 is turned on, the switch SW2 is turned off, and the input voltage VIN charges the inductor L1 via the switch SW1, such that the inductor current $I_L$ will gradually increase. Conversely, during the off-time TOFF, the switching control signal $SIG_{SW}$ is in a logic low voltage, and at this time, the switch SW1 is turned off, and the switch SW2 is turned on. In such case, the inductor L1 may form a discharge current loop through the load LD and the switch SW2 such that the inductor current $I_L$ will gradually decrease. Further, when the inductor current $I_L$ is greater than the output current $I_{OUT}$ drawn by the load LD, the output voltage VOUT will increase, and when the inductor current $I_L$ is smaller than the output current $I_{OUT}$ drawn by the load LD, the output voltage VOUT will decrease.

In the present example, when the control signal generator 110 detects that the output voltage VOUT is low, it may adjust the switching control signal $SIG_{SW}$ from the logic low voltage to the logic high voltage, and keep the on-time TON for a fixed length to turn on the switch SW1 again, so as to maintain the output voltage VOUT within a range close to the target voltage.

In the period P1 of FIG. 2, the voltage converter 10 is in a steady state, and hence, the on-time TON of each cycle of the switching control signal $SIG_{SW}$ is the same, and the off-time TOFF of each cycle is close. However, in the period P2, because the load LD of the voltage converter 10 suddenly draws a large current (i.e., the output current $I_{OUT}$ increases), the output voltage VOUT becomes too low. At this time, the control signal generator 110 will correspondingly shorten the off-time TOFF without changing the length of on-time TON, so as to increase the frequency for charging the inductor L1, thereby increasing the voltage value of the output voltage VOUT. In such case, since the off-time TOFF in each cycle of the switching control signal $SIG_{SW}$ is shortened, the frequency of the switching control signal $SIG_{SW}$ is also increased accordingly.

In the present example, to avoid the switching control signal $SIG_{SW}$ from continuously deviating from the originally set target frequency, the switching frequency controller 120 can monitor the frequency of the switching control signal $SIG_{SW}$ and adjust the on-time length of the switching control signal $SIG_{SW}$ by adjusting a parameter of the control signal generator 110, so as to control the frequency of the switching control signal $SIG_{SW}$ within a preset range.

Figure 3:
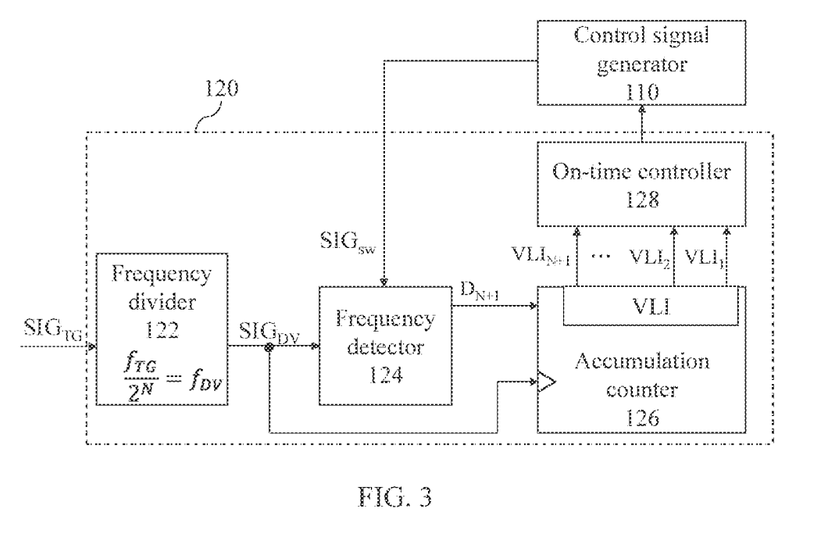
FIG. 3 is a schematic diagram illustrating a switching frequency controller in examples of the present disclosure.

FIG. 3 is a schematic diagram illustrating a switching frequency controller 120 according to one example of the present disclosure. The switching frequency controller 120 may include a frequency divider 122, a frequency detector 124, an accumulation counter 126 and an on-time controller 128. As shown in FIG. 3, the frequency detector 124 can be coupled to the frequency divider 122, the accumulation counter 126 can be coupled to the frequency detector 124, and the on-time controller 128 can be coupled to the frequency divider 122, the accumulation counter 126 and the control signal generator 110.

Figure 4:
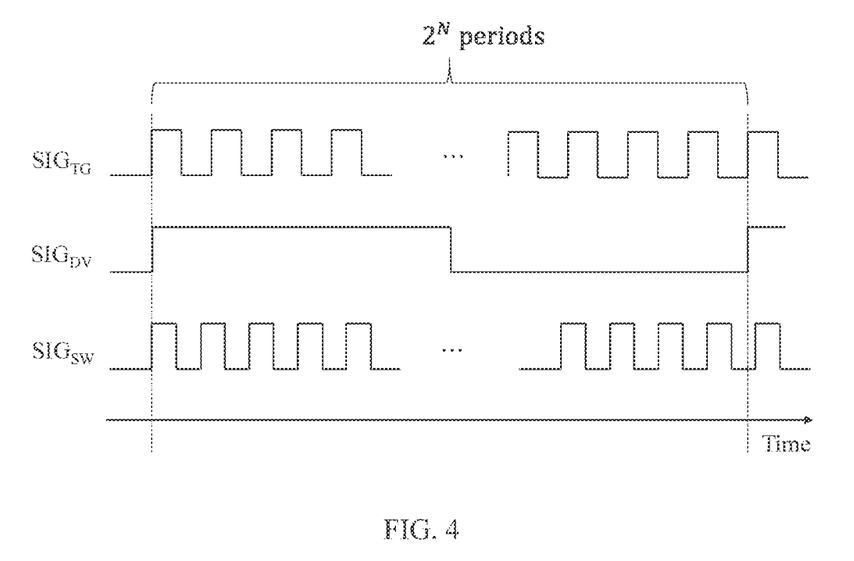
FIG. 4 is a waveform diagram of the signal of a target signal, a divisional signal and a switching control signal in examples of the present disclosure.

The frequency divider 122 may receive a target signal $SIG_{TG}$ having a target frequency $f_{TG}$, and may generate a divisional signal $SIG_{DV}$ having a divisional frequency $f_{DV}$ according to the target signal $SIG_{TG}$. In the present example, the target frequency $f_{TG}$ may be $2^N$ times of the divisional frequency $f_{DV}$, wherein N is an integer. The frequency detector 124 may receive the divisional signal $SIG_{DV}$ and the switching control signal $SIG_{SW}$. In the present example, the frequency detector 124 may calculate the number of periods of the switching control signal $SIG_{SW}$ that pass by during each cycle of the divisional signal $SIG_{DV}$. FIG. 4 is a waveform diagram of the signal of the target signal $SIG_{TG}$, the divisional signal $SIG_{DV}$ and the switching control signal $SIG_{SW}$.

In such case, if the frequency $f_{SW}$ of the switching control signal $SIG_{SW}$ is greater than the target frequency $f_{TG}$, then the number of periods calculated by the frequency detector 124 will be greater than $2^N$. On the contrary, if the frequency $f_{SW}$ of the switching control signal $SIG_{SW}$ is smaller than the target frequency $f_{TG}$, then the number of periods calculated by the frequency detector 124 should be smaller than $2^N$. In the present example, the frequency detector 124 may use (N+1) bits to represent the number of periods; in this way, the most significant bit of the number of periods $D_{N+1}$ can be used to determine the relationship between the frequency $f_{SW}$ of the switching control signal $SIG_{SW}$ and the target frequency $f_{TG}$. For example, when the most significant bit of the number of periods $D_{N+1}$ is 1, it indicates that the number of periods calculated by the frequency detector 124 may be greater than $2^N$; at this time, the frequency $f_{SW}$ of the switching control signal $SIG_{SW}$ may be greater than the target frequency $f_{TG}$. Conversely, when the most significant bit of the number of periods $D_{N+1}$ is 0, it indicates that the number of periods calculated by the frequency detector 124 should be smaller than $2^N$, at this time the frequency $f_{SW}$ of the switching control signal $SIG_{SW}$ is smaller than the target frequency $f_{TG}$.

In the present example, the accumulation counter 126 may first set the internal indication value VLI as a starting value, and may increase or decrease the internal indication value VLI according to the most significant bit of the number of periods $D_{N+1}$, such that a difference between the indication value VLI and its starting value can reflect the relationship between the frequency $f_{SW}$ of the control signal $SIG_{SW}$ and the target frequency $f_{TG}$. In such case, the on-time controller 128 can adjust the parameter of the control signal generator 110 according to the indication value VLI value, so as to adjust the length of the on-time TON of the switching control signal $SIG_{SW}$, and such that the frequency $f_{SW}$ of the switching control signal $SIG_{SW}$ can approach the target frequency $f_{TG}$.

For example, the accumulation counter 126 may represent the indication value VLI by (N+1) individual bits $VLI_{N+1}$ to $VLI_1$, and its starting value may be set to $2^{N+1}$ i.e., the most significant bit of the indication value VLI VLIN+1 is 1 and the other bits $VLI_N$ to $VLI_1$ are 0. Next, when the most significant bit $D_{N+1}$ of the cycle count is 1, the accumulation counter 126 can increase the indication value VLI by a predetermined amount, for example, but not limited to, 1, and when the most significant bit of the number of periods $D_{N+1}$ is 0, the accumulation counter 126 can decrease the indication value VLI by a predetermined amount, for example, but not limited to 1. In such case, when the indication value VLI is greater than the starting value $2^{N+1}$ it indicates that the frequency $f_{SW}$ of the switching control signal $SIG_{SW}$ may be greater than the target frequency $f_{TG}$; at this time, the on-time controller 128 can extend the on-time length of the switching control signal $SIG_{SW}$, so as to reduce the frequency $f_{SW}$ of the switching control signal $SIG_{SW}$. Conversely, when the indication value VLI is smaller than the starting value $2^{N+1}$, it indicates that the frequency $f_{SW}$ of the switching control signal $SIG_{SW}$ may be smaller than the target frequency $f_{TG}$; at this time the on-time controller 128 may shorten the on-time length of the switching control signal $SIG_{SW}$, so as to increase the frequency $f_{SW}$ of the switching control signal $SIG_{SW}$.

In addition, in order to avoid adjusting the frequency $f_{SW}$ of the switching control signal $SIG_{SW}$ too frequently, in some examples, when the indication value VLI falls within a predetermined range; for example, the difference between the indication value VLI and the starting value is smaller than a specific value, such as, when the difference between the indication value VLI and the starting value $2^{N+1}$ is less than 2 or 3, the on-time controller 128 can keep the on-time length of the switching control signal $SIG_{SW}$ unchanged, however, the present disclosure is not limited thereto.

In the present example, the accumulation counter 126 may further receive the divisional signal $SIG_{DV}$, and may use the divisional signal $SIG_{DV}$ as a clock signal for operation. In other words, the accumulation counter 126 may update the indication value VLI according to the frequency $f_{DV}$ of the divisional signal $SIG_{DV}$, and hence, the on-time controller 128 may correspondingly adjusts the on-time length of the switching control signal $SIG_{SW}$ every $2^N$ periods of the target signal $SIG_{TG}$. In this way, it can avoid adjusting the on-time length of the switching control signal $SIG_{SW}$ too frequently and affecting the stability of the system.

Further, when the indication value VLI is greater than its starting value $2^{N+1}$, and the difference increases gradually, it indicates that after several adjustments of the on-time length of the switching control signal $SIG_{SW}$, the frequency $f_{SW}$ of the switching control signal $SIG_{SW}$ is still greater than the target frequency $f_{TG}$; in such case, to allow the frequency $f_{SW}$ of the switching control signal $SIG_{SW}$ to approach the target frequency $f_{TG}$ more quickly, the on-time controller 128 can increase the adjustment to the on-time length of the switching control signal $SIG_{SW}$ in a larger extent. In other words, in some examples, the on-time controller 128 can adjust the on-time length of the switching control signal $SIG_{SW}$ to a larger extent as the difference between the indication value VLI and the starting value $2^{N+1}$ becomes larger.

In the present example, the on-time controller 128 may adjust the on-time length of the switching control signal $SIG_{SW}$ by adjusting a parameter of the control signal generator 110 that are associated with the on-time length. For example, in some examples, the control signal generator 110 may use a ramp voltage and reference voltage to generate an on-time with a desired length, and thereby generate the switching control signal $SIG_{SW}$. In such case, the on-time controller 128 can adjust the on-time length of the switching control signal $SIG_{SW}$ by adjusting a parameter related to the ramp voltage or adjust the reference voltage.

Figure 5:
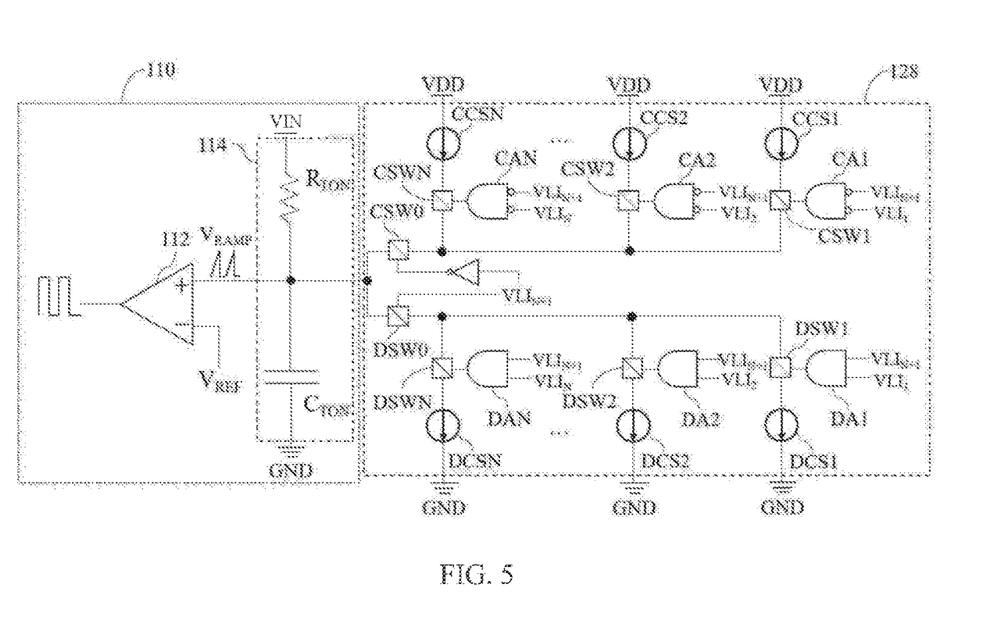
FIG. 5 is a schematic diagram illustrating circuits related to the on-time length in an on-time controller and a control signal generator in examples of the present disclosure.

FIG. 5 is a schematic diagram illustrating circuits related to the on-time length in the on-time controller 128 and the control signal generator 110 according to one example of the present disclosure. As shown in FIG. 5, the control signal generator 110 may include a comparator 112 and a ramp generator 114. The ramp generator 114 may generate a sawtooth voltage $V_{RAMP}$, when the sawtooth voltage $V_{RAMP}$ starts increasing, the on-time controller 128 starts calculating the on-time, and when the sawtooth voltage $V_{RAMP}$ reaches a reference voltage $V_{REF}$, the on-time controller 128 stops calculating the on-time; at this time, the control signal generator 110 will also conduct a discharge path so that the sawtooth voltage $V_{RAMP}$ returns to a low voltage. In other words, the length of time it takes for the sawtooth voltage $V_{RAMP}$ to rise from the ground voltage VSS to the reference voltage $V_{REF}$ is the on-time length of the switching control signal $SIG_{SW}$, it should be noted that in order to output the complete switching control signal $SIG_{SW}$, the control signal generator 110 may further include other components (such as the above-mentioned components configured to provide the discharge path); however, such components are not shown in detail here in order to keep the drawings and description concise; in some examples, the control signal generator 110 may be implemented according to any existing and suitable control signal generator of a voltage converter.

As shown in FIG. 5, the ramp generator 114 may use the input voltage VIN to charge the capacitor $C_{TON}$ through the resistor $R_{TON}$ to form the rising portion of the sawtooth voltage $V_{RAMP}$, and hence, in some examples, the on-time controller 128 may adjust the on-time length of the switching control signal $SIG_{SW}$ by adjusting the resistor $R_{TON}$ or the capacitor $C_{TON}$. However, in the present example, the on-time controller 128 adjusts the on-time length of the switching control signal $SIG_{SW}$ by adjusting the charging current of the capacitor $C_{TON}$.

In FIG. 5, the on-time controller 128 may include N adjustment current sinks DCS1 to DCSN and N adjustment current sources CCS1 to CCSN. In the present example, the adjustment current sinks DCS1 to DCSN can be coupled to the ground terminal GND, and may draw some of the current that would otherwise flow into the capacitor $C_{TON}$, so that the charging current from the ramp generator 114 to the capacitor $C_{TON}$ decreases. In such case, the speed of the sawtooth voltage $V_{RAMP}$ rising to the reference voltage $V_{REF}$ will be slowed down, and therefore the on-time length will be extended. Conversely, the adjustment current sources CCS1 to CCSN can be coupled to the power supply voltage VDD and can output currents to the capacitor $C_{TON}$, so that the ramp generator 114 can increase the current charging the capacitor $C_{TON}$, so that the charging current from the ramp generator 114 to the capacitor $C_{TON}$ increases. In such case, the sawtooth wave voltage $V_{RAMP}$ will rise to the reference voltage $V_{REF}$ in a quicker speed, thereby shortening the on-time length.

In the present example, since the value of the most significant bit $VLI_{N+1}$ of the indication value VLI can be used to reflect the relationship between the frequency $f_{SW}$ of the switching control signal $SIG_{SW}$ and the target frequency $f_{TG}$ presently, the on-time controller 128 may determine whether to enable the adjustment current sinks DCS1 to DCSN or the adjustment current sources CCS1 to CCSN according to the most significant bit $VLI_{N+1}$ of the indication value VLI. For example, when the most significant bit $VLI_{N+1}$ is 1, it indicates that the frequency $f_{SW}$ of the switching control signal $SIG_{SW}$ is higher than the target frequency $f_{TG}$; at this time, the current sink switch DSW0 can be turned on to enable at least one of the adjustment current sinks DCS1 to DCSN, so as to extend the on-time length of the switching control signal $SIG_{SW}$ and decrease the frequency $f_{SW}$ of the switching control signal $SIG_{SW}$. Conversely, when the most significant bit $VLI_{N+1}$ is 0, it indicates that the frequency $f_{SW}$ of the switching control signal $SIG_{SW}$ is smaller than the target frequency $f_{TG}$; at this time, the current source switch CSW0 is turned on to enable at least one of the adjustment current sources CCS1 to CCSN, so as to shorten the on-time length of the switching control signal $SIG_{SW}$ and increase the frequency $f_{SW}$ of the switching control signal $SIG_{SW}$.

Further, in the present example, the adjustment current sinks DCS1 to DCSN may be configured to draw different amounts of currents respectively. For example, the current flowing into the adjustment current sink DCSn may be twice the current flowing into the adjustment current sink DCS (n–1), wherein n is any integer between 2 to N; also, the current flowing into the adjustment current sink DCS2 may be twice the current flowing into the adjustment current sink DCS1, and the current flowing into the adjustment current sink DCS3 may be twice the current flowing into the adjustment current sink DCS2, and so on.

In such case, the on-time controller 128 may further enable the corresponding adjustment current sink of adjustment current sinks DCS1 to DCSN according to the other bit $VLI_N$ to $VLI_1$ of the indication value VLI. As shown in FIG. 5, the on-time controller 128 may further include current sink switches DSW1 to DSWN, wherein each of the current sink switches DSW1 to DSWN may be respectively configured to control the electric connection between one corresponding adjustment current sink of the adjustment current sinks DCS1 to DCSN and the ramp generator 114. For example, the adjustment current sinks DCS1 may be coupled to the ramp generator 114 via the current sink switch DSW1, and the adjustment current sink DCS2 may be coupled to the ramp generator 114 via the current sink switch DSW2, and so on.

In the present example, the on-time controller 128 may further include N AND gates DA1 to DAN, wherein each of the AND gates DA1 to DAN may receive the most significant bit $VLI_{N+1}$ of the indication value VLI and another corresponding bit so as to generate a control signal for one corresponding current sink switch of the current sink switches DSW1 to DSWN. For example, the AND gate DA1 may receive the most significant bit $VLI_{N+1}$ and the least significant bit $VLI_1$ of the indication value VLI and may perform a logic AND computation on the most significant bit $VLI_{N+1}$ and the least significant bit $VLI_1$ of the indication value VLI, so as to generate the control signal of the current sink switch DSW1. Similarly, the AND gate DA2 may receive most significant bit $VLI_{N+1}$ and a second bit VLI2 of the indication value VLI, and may perform the logic AND computation on the most significant bit $VLI_{N+1}$ and the second bit VLI2 of the indication value VLI, so as to generate the control signal of the current sink switch DSW2. In other words, the current sink switch DSW1 would be turned on when the most significant bit $VLI_{N+1}$ and the least significant bit $VLI_1$ of the indication value VLI are both 1. The current sink switch DWS2 would be turned on when the most significant bit $VLI_{N+1}$ and the second bit VLI2 are both 1. In this way, when the most significant bit $VLI_{N+1}$ of the indication value VLI is 1, the on-time controller 128 can enable the adjustment current sinks DCS1 to DCSN according to the value of other bits $VLI_N$ to $VLI_1$ of the indication value VLI, so that the greater the difference between the indication value VLI and the starting value $2^{N+1}$, the larger the magnitude of the charging current of the ramp generator 114 is decreased, thereby causing a larger extent in increase of the on-time length of the switching control signal $SIG_{SW}$.

Further, in the present example, when the indication value VLI is $(2^{N+1})$ or $(2^{N+1}-1)$, the on-time controller 128 may not enable any current source or current sink, to avoid unnecessarily adjusting the on-time length of the switching control signal $SIG_{SW}$ and causing system instability. In such case, adjustment current sources CCS1 to CCSN can also operate according to a principle similar to the operation of adjustment current sinks DCS1 to DCSN. For example, the current outputted by the adjustment current source CCSn may be twice the current outputted by the adjustment current source CCS(n–1). In such case, the on-time controller 128 may also enable the corresponding adjustment current source of adjustment current sources CCS1 to CCSN according to the other bits bit $VLI_N$ to $VLI_1$ of the indication value VLI.

For example, the on-time controller 128 may further include current source switches CSW1 to CSWN and AND gates CA1 to CAN, wherein each of the AND gates CA1 to CAN may generate the control signal of a corresponding current source switch of the current source switches CSW1 to CSWN according to the most significant bit $VLI_{N+1}$ of the indication value VLI and another corresponding bit of the indication value VLI. In the present example, the on-time controller 128 will only enable adjustment current sources CCS1 to CCSN according to the value of the other bits bit $VLI_N$ to $VLI_1$ of the indication value VLI when the most significant bit $VLI_{N+1}$ of the indication value VLI is 0. Further, as discussed above, in the present example, when the indication value VLI is $(2^{N+1}-1)$ (that is, except for the most significant bit $VLI_{N+1}$, the other bits $VLI_N$ to $VLI_1$ are all 1), the on-time controller 128 will not enable any adjustment current sources CCS1 to CCSN, and will start enabling adjustment current sources CCS1 to CCSN after the difference between the indication value VLI and the starting value $2^{N+1}$ is greater than 1.

Hence in FIG. 5, each of the AND gates CA1 to CAN may receive an inverted value of the most significant bit of the indication value VLI (generated by an inverter) and an inverted value of another corresponding bit (generated by the inverter) to generate the control signal of a corresponding current source switch of the current source switch CSW1 to CSWN. For example, the AND gate CA1 may receive the inverted value of the most significant bit $VLI_{N+1}$ and the inverted value of and the least significant bit $VLI_1$ of the indication value VLI, and hence the current source switch CSW1 is turned on when the most significant bit $VLI_{N+1}$ and the least significant bit $VLI_1$ of the indication value VLI are both 0, and the adjustment current source CCS1 may output a charging current to the capacitor $C_{TON}$ accordingly. Similarly, the AND gate CA2 may receive the inverted value of the most significant bit $VLI_{N+1}$ and the inverted value of a second bit VLI2 of the indication value VLI, and hence the current source switch CSW2 is turned on when the most significant bit VLI$_{N+1}$ and a second bit VLI2 of the indication value VLI are both 0, and the adjustment current source CCS2 may output a charging current to the capacitor C$_{TON}$ accordingly.

In the present example, the on-time controller 128 adjusts the on-time length of the switching control signal SIG$_{SW}$ by adjusting the current value of the control signal generator 110 that is related to the on-time length; however, the present disclosure is not limited thereto. In other examples of the present disclosure, the on-time controller 128 may also adjust the on-time length of the switching control signal SIG$_{SW}$ by adjusting other parameters, such as, but not limited to, the reference voltage value V$_{REF}$, the value of the resistor R$_{TON}$ or the value of the capacitor C$_{TON}$. Further, the on-time controller 128 may also adjust the on-time length of the switching control signal SIG$_{SW}$ by simultaneously adjusting multiple parameters of the above-mentioned parameters.

Since the voltage converter 10 according to the present disclosure can use the switching frequency controller 120 therein to monitor the frequency of the switching control signal SIG$_{SW}$ and adjust the on-time length of the switching control signal SIG$_{SW}$ correspondingly, it can effectively control the switching control signal SIG$_{SW}$ to be in a range close to the target frequency f$_{TG}$, thereby reducing the issues of electromagnetic interference and degradation of circuit performance that may arise in the prior art.

Figure 6:
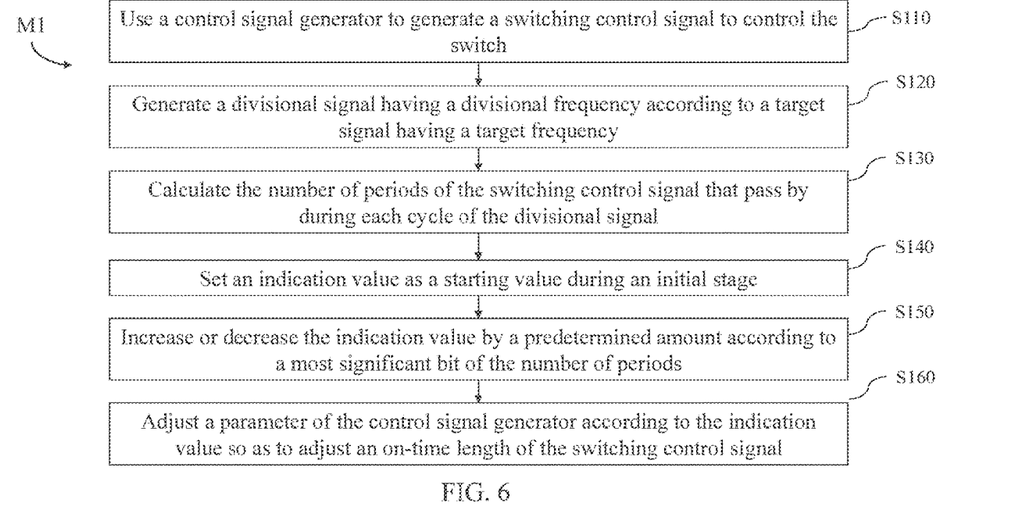
FIG. 6 is a flow diagram illustrating methods for controlling a switching frequency in examples of the present disclosure.

FIG. 6 is a flow diagram illustrating a method M1 for controlling a switching frequency according to one example of the present disclosure. As shown in FIG. 6, the method of the M1 may include steps S110 to S160. In some examples, the method M1 may be applied to the voltage converter 10. For example, the control signal generator 110 may perform Step S110 to generate the switching control signal SIG$_{SW}$, and the frequency divider 122 may perform Step S120 to generate the divisional signal SIG$_{DV}$ according to the target signal SIG$_{TG}$. Next, in Step S130, the frequency detector 124 may calculate the number of periods of the switching control signal SIG$_{SW}$ that pass by during each cycle of the divisional signal SIG$_{DV}$. In Step S140, the accumulation counter 126 may set the internal indication value VLI as the starting value, and in Step S150, it may correspondingly increase or decrease the internal indication value VLI by a predetermined amount according to the most significant bit of the number of periods D$_{N+1}$ calculated by the frequency detector 124. In this way, in Step S160, the on-time controller 128 may adjust the on-time length of the switching control signal SIG$_{SW}$ according to the indication value VLI, so as to increase or decrease the frequency of the switching control signal SIG$_{SW}$.

In summary, the switching frequency controller, the voltage converter and the method for controlling the switching frequency provided by the examples of the present disclosure can monitor the frequency of the switching control signal by dividing the target frequency and then comparing it with the switching control frequency, and can adjust the on-time length of the switching control signal accordingly, so that the switching control signal can be effectively controlled within a range close to the target frequency, thereby reducing the issues of electromagnetic interference and degradation of circuit performance that may arise in the prior art.

Those of ordinary skill in the art may recognize that modifications of the embodiments disclosed herein are possible. For example, a number of periods that pass by during each cycle of the divisional signal may vary. Other modifications may occur to those of ordinary skill in this art, and all such modifications are deemed to fall within the purview of the present invention, as defined by the claims.

The invention claimed is:

1. A switching frequency controller comprising:
a frequency divider, configured to generate a divisional signal having a divisional frequency according to a target signal having a target frequency, wherein the target frequency is $2^N$ times of the divisional frequency, and wherein N is a positive integer;
a frequency detector coupled to the frequency divider, the frequency detector being configured to
receive
the divisional signal generated by the frequency divider, and
a switching control signal generated by a control signal generator, and
calculate a number of periods of the switching control signal that pass by during each cycle of the divisional signal,
wherein each cycle of the divisional signal comprises an on-time and an off-time having different potentials, and
wherein the number of periods is represented by (N+1) bits;
an accumulation counter coupled to the frequency detector, the accumulation counter being configured to
set an indication value as a starting value during an initial stage, and
increase or decrease the indication value by a predetermined amount according to a most significant bit of the number of periods; and
an on-time controller coupled to the accumulation counter, the on-time controller being configured to adjust a parameter of the control signal generator according to the indication value so as to adjust an on-time length of the switching control signal;
wherein a frequency of the switching control signal is effectively controlled within a preset range close to the target frequency.

2. The switching frequency controller according to claim 1,
wherein the on-time controller adjusts at least one of a charge current value, a reference voltage value, a resistance value, and a capacitance value of the switching control signal of the control signal generator according to the indication value so as to adjust the on-time length of the switching control signal.

3. A switching frequency controller comprising:
a frequency divider, configured to generate a divisional signal having a divisional frequency according to a target signal having a target frequency, wherein the target frequency is $2^N$ times of the divisional frequency, and wherein N is a positive integer;
a frequency detector coupled to the frequency divider, the frequency detector being configured to
receive
the divisional signal generated by the frequency divider, and
a switching control signal generated by a control signal generator, and calculate a number of periods of the switching control signal that pass by during
each cycle of the divisional signal,
wherein each cycle of the divisional signal comprises an on-time and an off-time having different potentials, and wherein the number of periods is represented by (N+1) bits;

an accumulation counter coupled to the frequency detector, the accumulation counter being configured to
set an indication value as a starting value during an initial stage, and
increase or decrease the indication value by a predetermined amount according to a most significant bit of the number of periods; and an on-time controller coupled to the accumulation counter, the on-time controller being configured to adjust a parameter of the control signal generator according to the indication value so as to adjust an on-time length of the switching control signal;

wherein:
when the most significant bit of the number of periods is 1, the accumulation counter increases the indication value by the predetermined amount, and when the most significant bit of the number of periods is 0, the accumulation counter decreases the indication value by the predetermined amount.

4. The switching frequency controller according to claim 3, wherein:
when the indication value is greater than the starting value, the on-time controller extends the on-time length of the switching control signal; and
when the indication value is smaller than the starting value, the on-time controller shortens the on-time length of the switching control signal.

5. The switching frequency controller according to claim 3, wherein:
a greater a difference between the indication value and the starting value, a larger extent that the on-time controller adjusts the on-time length of the switching control signal.

6. The switching frequency controller according to claim 3, wherein the indication value comprises (N+1) bits, and the starting value is $2^N$.

7. The switching frequency controller according to claim 3, wherein:
when the indication value is in a predetermined range, the on-time controller keeps the on-time length of the switching control signal unchanged.

8. The switching frequency controller according to claim 3, wherein the on-time controller comprises:
N adjustment current sources, wherein an $(n)^{th}$ adjustment current source is configured to output a current to a capacitor of the control signal generator according to an $(N+1)^{th}$ bit and an $(n)^{th}$ bit of the indication value so as to increase a charging current of the capacitor, and wherein n is any integer between 1 to N; and
N adjustment current sinks, wherein an $(n)^{th}$ adjustment current sink is configured to draw a current from the capacitor of the control signal generator according to the $(N+1)^{th}$ bit and the $(n)^{th}$ bit of the indication value so as to decrease the charging current of the capacitor.

9. The switching frequency controller according to claim 8, wherein the current outputted by the $(n)^{th}$ adjustment current source is twice a current outputted by a $(n-1)^{th}$ adjustment current source; wherein the current drawn into the $(n)^{th}$ adjustment current sink is twice a current drawn into a $(n-1)^{th}$ adjustment current sink; and wherein n is any integer between 2 to N.

10. The switching frequency controller according to claim 1, wherein the accumulation counter is further configured to receive the divisional signal, and wherein the accumulation counter operates by using the divisional signal as a clock signal.

11. A voltage converter, comprising:
the switching frequency controller according to claim 1; and
the control signal generator.

12. The voltage converter according to claim 11, further comprising:
a first switch comprising
a first terminal configured to receive an input voltage,
a second terminal, and
a control terminal configured to receive the switching control signal;
a second switch comprising
a first terminal coupled to the second terminal of the first switch,
a second terminal coupled to a ground terminal, and
a control terminal configured to receive an inverted control signal that is complement to the switching control signal;
an inductor comprising
a first terminal coupled to the second terminal of the first switch, and
a second terminal configured to output an output voltage after conversion; and
a capacitor comprising
a first terminal coupled to the second terminal of the inductor, and
a second terminal coupled to the ground terminal.

13. A method for controlling a switching frequency of a switch, the method comprising the steps of:
using a control signal generator to generate a switching control signal to control the switch, wherein each cycle of a divisional signal comprises an on-time and an off-time having different potentials;
generating the divisional signal having a divisional frequency according to a target signal having a target frequency, wherein the target frequency is $2^N$ times of the divisional frequency, and wherein N is a positive integer;
calculating a number of periods of the switching control signal that pass by during each cycle of the divisional signal, wherein the number of periods is represented by (N+1) bits;
setting an indication value as a starting value during an initial stage;
increasing or decreasing the indication value by a predetermined amount according to a most significant bit of the number of periods; and
adjusting a parameter of the control signal generator according to the indication value so as to adjust an on-time length of the switching control signal;
wherein a frequency of the switching control signal is effectively controlled within a preset range close to the target frequency.

14. The method according to claim 13, wherein the step of adjusting the parameter of the control signal generator comprises adjusting at least one of a charge current value, a reference voltage value, a resistance value, and a capacitance value of the control signal generator so as to adjust the on-time length of the switching control signal.

15. The method according to claim 13, wherein the step of increasing or decreasing the indication value comprises:
increasing the indication value by the predetermined amount when the most significant bit of the number of periods is 1; and decreasing the indication value by the predetermined amount when the most significant bit of the number of periods is 0.

16. The method according to claim 15, wherein the step of adjusting the parameter of the control signal generator comprises:
   extending the on-time length of the switching control signal when the indication value is greater than the starting value; and
   shortening the on-time length of the switching control signal when the indication value is smaller than the starting value.

17. The method according to claim 16, wherein the step of adjusting the parameter of the control signal generator further comprises:
   adjusting the on-time of the switching control signal by an amount proportional to a difference between the indication value and the starting value.

18. The method according to claim 15, wherein the indication value comprises (N+1) bits, and wherein the starting value is $2^N$.

19. The method according to claim 13, wherein the step of adjusting the parameter of the control signal generator further comprises:
   keeping the on-time length of the switching control signal unchanged when the indication value is in a predetermined range.

20. The method according to claim 13, wherein the step of increasing or decreasing the indication value is performed once during each cycle of the divisional signal.

* * * * *